(12) United States Patent
Kaufmann et al.

(10) Patent No.: US 10,605,872 B2
(45) Date of Patent: Mar. 31, 2020

(54) CALIBRATION METHOD FOR A HALL EFFECT SENSOR

(71) Applicant: TDK-Micronas GmbH, Freiburg (DE)

(72) Inventors: Timo Kaufmann, Waldkirch-Suggental (DE); Joerg Franke, Freiburg (DE)

(73) Assignee: TDK-Micronas GmbH, Freiburg (DE)

( * ) Notice: Subject to any disclaimer, the term of this patent is extended or adjusted under 35 U.S.C. 154(b) by 6 days.

(21) Appl. No.: 15/843,815

(22) Filed: Dec. 15, 2017

(65) Prior Publication Data
US 2018/0172780 A1 Jun. 21, 2018

(30) Foreign Application Priority Data

Dec. 15, 2016 (DE) .................. 10 2016 014 891

(51) Int. Cl.
*G01R 33/00* (2006.01)
*G01R 35/00* (2006.01)
*G01R 33/07* (2006.01)

(52) U.S. Cl.
CPC ......... *G01R 33/0035* (2013.01); *G01R 33/07* (2013.01); *G01R 35/005* (2013.01)

(58) Field of Classification Search
CPC ......... H01L 2924/0002; H01L 2924/00; H01L 21/68; H01L 22/12; H01L 27/22; G01D 5/145; G01D 5/14; G01D 5/2448; G01D 5/142; G01D 5/2013; G01D 5/24485; G01R 33/07; G01R 33/077; G01R 15/202; G01R 33/0035; G01R 33/0017; G01R 33/0082; G01R 33/09; G01R 19/32; G01R 31/2851; G01R 31/2884; G01R 33/00; G01R 33/0064; G01R 33/0094; G01R 33/075; G01R 33/093; G01R 35/00; H02P 6/16; H02K 29/08; H02K 11/215; H02K 11/25
See application file for complete search history.

(56) References Cited

U.S. PATENT DOCUMENTS 8,357,983 B1 * 1/2013 Wang .................. G01R 33/07
257/257
8,466,526 B2 * 6/2013 Hioka .................. H01L 43/065
257/421
(Continued)

FOREIGN PATENT DOCUMENTS

DE 10 2013 008 794 A1 11/2014

OTHER PUBLICATIONS

H. Xu et al., "Batch-fabricated high-performance graphene Hall elements", Scientific Reports 3, 1207 (2013), pp. 1-8.

*Primary Examiner* — Vinh P Nguyen
(74) *Attorney, Agent, or Firm* — Muncy, Geissler, Olds & Lowe, P.C.

(57) ABSTRACT

A calibration method for a Hall sensor having a Hall sensitive layer with four electrical contacts and a first field plate, wherein, at a first temperature and at a first magnetic flux density, a resistance value of the Hall sensitive layer is determined for each of at least three different field plate voltages present at the field plate, a calibration curve is produced from the at least three resistance values, a deviation value of the calibration curve is determined from a reference calibration curve, and the field plate voltage that is present at the first field plate or an operating voltage that is present at the sensitive layer is readjusted by a correction value corresponding to the deviation value.

7 Claims, 1 Drawing Sheet

(56) References Cited

U.S. PATENT DOCUMENTS

| | | | |
|---|---|---|---|
| 9,166,145 B2 | 10/2015 | Franke | |
| 2010/0207222 A1* | 8/2010 | Wang | H01L 43/065 257/425 |
| 2014/0009221 A1* | 1/2014 | Motz | G01R 33/0029 327/564 |
| 2018/0172779 A1* | 6/2018 | Stahl-Offergeld | G01R 33/0017 |

* cited by examiner

CALIBRATION METHOD FOR A HALL EFFECT SENSOR

This nonprovisional application claims priority under 35 U.S.C. § 119(a) to German Patent Application No. 10 2016 014 891.8, which was filed in Germany on Dec. 15, 2016, and which is herein incorporated by reference.

BACKGROUND OF THE INVENTION

Field of the Invention

The invention relates to a calibration method for a Hall effect sensor.

Description of the Background Art

It is known that the galvanomagnetic behavior of Hall sensors, which is to say the electrical and magnetic properties, change over their service life. This is especially true of Hall effect sensors with layers of graphene.

A Hall sensor with a graphene layer is known, for example, from DE 10 2013 008 794, which corresponds to U.S. Pat. No. 9,166,145, and which is incorporated herein by reference, and from the article entitled, "Batch-fabricated high-performance graphene Hall elements" by H. Xu et al., Scientific Reports 3, 1207 (2013).

SUMMARY OF THE INVENTION

It is therefore an object of the invention to provide a method that advances the state of the art.

According to an exemplary embodiment of the invention, a calibration method for a Hall sensor is provided, wherein the Hall sensor has a Hall sensitive layer with four electrical contacts and a first field plate.

In a calibration mode, at a first temperature and at a first magnetic flux density, a resistance value of the Hall sensitive layer is determined for each of at least two different field plate voltages present at the field plate.

Using the resistance values obtained, a calibration curve is calculated; preferably the calibration curve indicates the resistance or the charge carrier mobility or the sensitivity of the Hall sensitive layer as a function of the field plate voltage.

Next, a deviation value of the calibration curve is determined from a reference calibration curve.

In an embodiment, an error pointer or an error flag is set, or a field plate voltage that is present at the first field plate during a normal operating mode of the Hall sensor or an operating voltage that is present at the sensitive layer during a measuring operation of the Hall sensor is readjusted or corrected by a correction value corresponding to the deviation value.

It should be noted that the terms normal operating mode and measuring mode are used synonymously. It is a matter of course that the field plate can be located directly above the Hall plate, wherein the field plate voltage is applied between the field plate and the Hall sensor.

It is a matter of course that when a magnetic field is present, the Hall sensitive layer generates a Hall voltage with a component of the magnetic flux that passes perpendicularly or substantially perpendicularly through the surface of the Hall sensitive layer, wherein an operating current passes through the Hall sensitive layer for this purpose.

The Hall sensitive layer can be implemented as, for example, a Hall plate, wherein the Hall plate is made in particular of a graphene compound or a III-V semiconductor or a silicon compound or includes one of the said compounds. In one improvement, the Hall sensitive layer includes an AMR or a GMR material.

Moreover, the error flag can be set by the silicon IC, and the error message can be made available as an output signal at an output of the silicon IC for further processing.

The field plate can be implemented as an electrically conductive, in particular metallic, layer. By means of the field plate or a change in a voltage level present at the field plate, the operating point of the Hall sensitive layer can be adjusted. In particular, a forming of surface currents can be suppressed.

It is possible by means of the applied voltage to set at the field plate the extent to which the Hall voltage of the Hall sensitive layer is created from electrons or holes.

In an embodiment, an electrically insulating passivation layer is located on or above the Hall sensitive layer, which is to say that the passivation layer is located between the field plate and the Hall sensitive layer.

For example, the passivation layer can be made of or includes a silicon-boron-nitride compound and/or a silicon nitride layer.

The reference calibration curve reproduces the dependency of the Hall sensitive layer on the field plate voltage at an initial point in time, e.g., at trimming in manufacture or at an initial placement in service of the Hall sensor.

The readjustment or the calibration preferably can be accomplished by an external control unit or by an IC connected in an electrically conductive manner to the Hall sensitive layer. It is also noted that the field plate can be wired, in other words is in operative electrical connection, to the external control unit or to the IC.

The control unit and the Hall plate can be monolithically integrated. In other words, the Hall plate is formed on the surface of the silicon semiconductor body and is covered with a passivation layer.

An advantage of the calibration method according to the invention is that it can be repeated over the entire service life of the Hall sensor without the need to remove the sensor for this purpose. Preferably, a predetermined magnetic field, which is to say a predetermined magnetic flux, is present during the calibration.

The calibration method can be provided as a calibration mode in addition to a normal operating mode and is carried out at regular time intervals and without additional aids.

According to an embodiment, the resistance values are determined by measurement on at least two electrical contacts of the Hall sensitive layer. Preferably, the resistance values are determined in accordance with the van der Pauw measurement method.

According to an embodiment, the field plate voltage is applied between the field plate and the Hall sensitive layer.

In an embodiment, in the calibration mode at a first temperature and at a first magnetic flux density, a resistance value of the Hall sensitive layer is determined for each of exactly three or more than three different field plate voltages present at the field plate.

Further scope of applicability of the present invention will become apparent from the detailed description given hereinafter. However, it should be understood that the detailed description and specific examples, while indicating preferred embodiments of the invention, are given by way of illustration only, since various changes, combinations, and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1A:
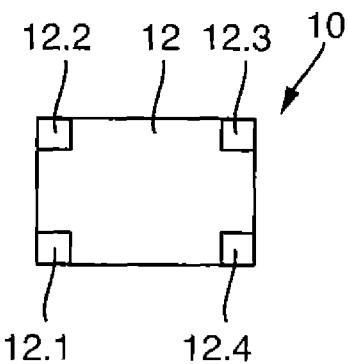
FIGS. 1a and 1b show a top view and a side view of a Hall sensor implemented as a Hall plate.
Figure 1B:
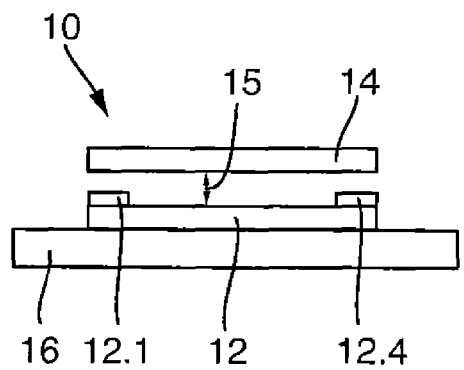

The illustrations in FIGS. 1a and 1b schematically show a schematic top view or a side view of a Hall sensor 10 to be calibrated. The Hall sensor has a Hall sensitive layer 12 implemented as a Hall plate, with four electrical contacts 12.1, 12.2, 12.3, 12.4 as well as a field plate 14 located above the Hall plate. The Hall sensitive layer 12 is separated from the field plate 14 by a distance 15, and is electrically insulated with respect thereto. The distance 15 is implemented as an air gap or includes one or more passivation layers. Located below the Hall plate is a substrate 16.

During a measuring operation of the Hall sensor, a constant field plate voltage $V_F$—not shown—is present at the field plate 14.

Both during calibration mode and during the measuring operation or measuring mode, an operating voltage is present at pairs of opposing contacts 12.1 and 12.3 or 12.2 and 12.4, or exactly no operating voltage is present, but instead only a voltage for determining the resistance value. A Hall voltage is sensed at the other pair of contacts 12.1 and 12.3 or 12.2 and 12.4 if a magnetic flux is passing through the Hall sensor.

In an embodiment, the resistance measurement is carried out at two contacts 12.1, 12.2, 12.3, and 12.4 that are not opposite one another.

Figure 2:
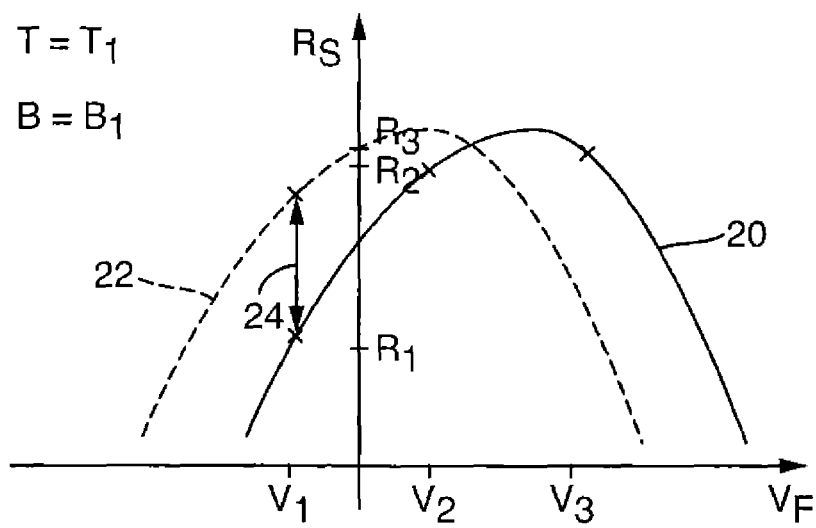
FIG. 2 shows an illustration of an embodiment according to the invention of the calibration method.

In the illustration in FIG. 2, an embodiment of the calibration method according to the invention is shown. While a first temperature T1 and a first magnetic flux density B1 are present, a first resistance value RS=R1 of the Hall-sensitive layer is determined for a first field plate voltage VF=V1 present at the field plate 14. In a corresponding manner, a second resistance value RS=R2 is determined for a second field plate voltage VF=V2. For example, an arched curve is only linearly approximated here. In a different embodiment, a third resistance value RS=R3 is additionally determined for a third field plate voltage VF=V3.

During the calibration mode, a resistance calibration curve is determined as a calibration curve 20 and compared with a reference calibration curve 22 using the three resistance values R1, R2, R3. A deviation value 24 of the calibration curve 20 from the reference calibration curve 22 is determined using the curves, for example the difference in resistance values of the two curves for a certain field plate voltage, or averaged over an interval of field plate voltages.

Next, the field plate voltage or an operating voltage present at the sensitive layer is readjusted by a correction value corresponding to the deviation value.

Figure 3A:
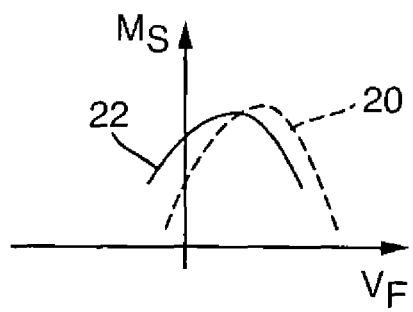
FIGS. 3a and 3b show an illustration of an embodiment of the calibration method.
Figure 3B:
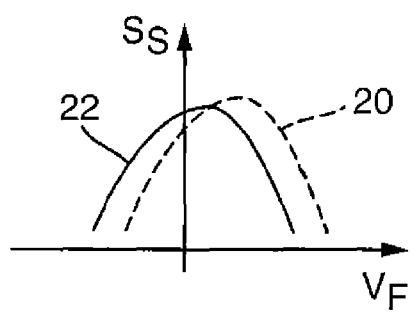

Alternatively, a mobility value or sensitivity value is calculated for each of the three resistance values R1, R2, R3, as is illustrated in FIGS. 3a and 3b. In this process, a mobility curve or a sensitivity curve is accordingly determined as calibration curve 20 from the mobility values or sensitivity values, and a deviation value from a corresponding reference curve 22 is determined.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A calibration method for a Hall sensor having a Hall sensitive layer with four electrical contacts and a first field plate, the method comprising:
    determining, at a first temperature and at a first magnetic flux density, a resistance value of the Hall sensitive layer for each of at least two different field plate voltages present at the field plate;
    calculating a calibration curve based on the at least two resistance values;
    determining a deviation value of the calibration curve from a reference calibration curve; and
    setting an error pointer or readjusting a field plate voltage that is present at the field plate during normal operating of the Hall sensor or readjusting an operating voltage that is present at the sensitive layer during an operation of the Hall sensor by a correction value corresponding to the deviation value.

2. The calibration method according to claim 1, wherein the calibration curve indicates a resistance of the Hall sensitive layer, a charge carrier mobility of the Hall sensitive layer, or a sensitivity of the Hall sensitive layer as a function of the field plate voltage.

3. The calibration method according to claim 1, wherein the resistance values are determined by measurement on at least two electrical contacts of the Hall sensitive layer.

4. The calibration method according to claim 1, wherein the resistance values are determined in accordance with a van der Pauw measurement method.

5. The calibration method according to claim 1, wherein the Hall sensitive is a Hall plate, wherein the Hall plate predominantly includes silicon or graphene, wherein the field plate is located directly above the Hall plate, and wherein the field plate voltage is applied between the field plate and the Hall plate.

6. The calibration method according to claim 1, wherein, in the calibration mode, at a first temperature and at a first magnetic flux density, a resistance value of the Hall sensitive layer is determined for at least three different field plate voltages present at the field plate.

7. A calibration method for a Hall sensor having a Hall sensitive layer with four electrical contacts and a first field plate, the method comprising:
    determining a resistance value of the Hall sensitive layer for each of at least two different field plate voltages present at the field plate;
    calculating a calibration curve based on the at least two resistance values;
    determining a deviation value of the calibration curve from a reference calibration curve; and
    performing:
        setting an error pointer;
        readjusting a field plate voltage that is present at the field plate during normal operating of the Hall sensor; or readjusting an operating voltage that is present at the sensitive layer during an operation of the Hall sensor by a correction value corresponding to the deviation value.

* * * * *